US007702494B1

(12) United States Patent
Slavik

(10) Patent No.: US 7,702,494 B1
(45) Date of Patent: Apr. 20, 2010

(54) METHOD AND SYSTEM FOR PRESCRIBING RIGID BODY ORIENTATIONS IN FINITE ELEMENT ANALYSIS

(75) Inventor: Todd Patrick Slavik, Livermore, CA (US)

(73) Assignee: Livermore Software Technology Corporation, Livermore, CA (US)

(*) Notice: Subject to any disclaimer, the term of this patent is extended or adjusted under 35 U.S.C. 154(b) by 945 days.

(21) Appl. No.: 11/458,248

(22) Filed: Jul. 18, 2006

(51) Int. Cl.
*G06F 9/455* (2006.01)
(52) U.S. Cl. ................ 703/7; 703/2; 345/474
(58) Field of Classification Search ............ 703/2, 703/6, 8, 7; 600/595, 424, 301; 702/19; 345/474, 419
See application file for complete search history.

(56) References Cited

U.S. PATENT DOCUMENTS

| | | | |
|---|---|---|---|
| 7,403,202 B1* | 7/2008 | Nash | 345/474 |
| 2003/0083596 A1* | 5/2003 | Kramer et al. | 600/595 |
| 2005/0119835 A1* | 6/2005 | Kita et al. | 702/19 |
| 2005/0192785 A1* | 9/2005 | Lewis et al. | 703/8 |
| 2006/0058592 A1* | 3/2006 | Bouma et al. | 600/301 |
| 2006/0098007 A1* | 5/2006 | Rouet et al. | 345/419 |
| 2006/0149516 A1* | 7/2006 | Bond et al. | 703/6 |
| 2006/0217942 A1* | 9/2006 | Daferner | 703/2 |
| 2006/0258938 A1* | 11/2006 | Hoffman et al. | 600/424 |

OTHER PUBLICATIONS

Oghbaei et al., "A new time-finite-element implicit integration scheme for multibody system dynamics simulation", Computer methods in applied mechanics and engineering, 2006.*

(Continued)

*Primary Examiner*—Paul L Rodriguez
*Assistant Examiner*—Kandasamy Thangavelu
(74) *Attorney, Agent, or Firm*—Roger H. Chu

(57) ABSTRACT

A system, method and software product for prescribing rigid body in finite element analysis is described. According to one aspect, user defines a rigid body orientation time history based on a variety of schemes including, but not limited to, direction cosine, orientation angles, Euler parameters, Rodriguez parameters, and Caley-Klein parameters. The unique combination in one of the schemes is converted to direction cosine time histories first. The direction cosine matrix can then be interpolated from either the defined or the converted direction cosine time history at each solution cycle. The time derivative of the direction cosine matrix and the resulting angular velocity matrix are calculated. The solution for the equation of motions is obtained using calculated angular velocity for each solution cycle until the simulation ends. According to another aspect, the present invention interpolates user specified rigid body orientations time history in several schemes including, piecewise linear, cubic spline.

15 Claims, 8 Drawing Sheets

OTHER PUBLICATIONS

Ridgely, J.R. et al., "Techniques for design and simulation of running robots", University of California, Berkeley, 2001.*

Traugott et al., "Nonlinear dynamics and control of actuated helicopter blades", American Institute of Aeronautics and Astronautics, 2005.*

Rose, S.E, "Experimental and theoretical modeling of a wind driven sensor platform for Martian surface exploration", Texas Tech University, 2004.*

Sgarioto, D.E, "Non-linear dynamic modeling and optimal control of aerial tethers for remote delivery and capture of payloads", RMIT university, 2006.*

Cai et al., "Active control of flexible hub-beam using optimal control tracking method", International journal of Mechanical Sciences, 2006.*

MADYMO Theory Manual Version 6.0 Apr. 2001 by TNO Automotive pp. 28, 30, 31, 34, 35, 36, 41, 42, 43 and 44.

MADYMO Reference Manual Version 6.0 Apr. 2001 by TNO Automotive pp. 290, 291 and 292.

Adams/Solver(TM) Reference Manual Version 8.0 Nov. 14, 1994 by Mechanical Dynamics pp. 2-64, 2-65, 2-66 and 2-67.

* cited by examiner

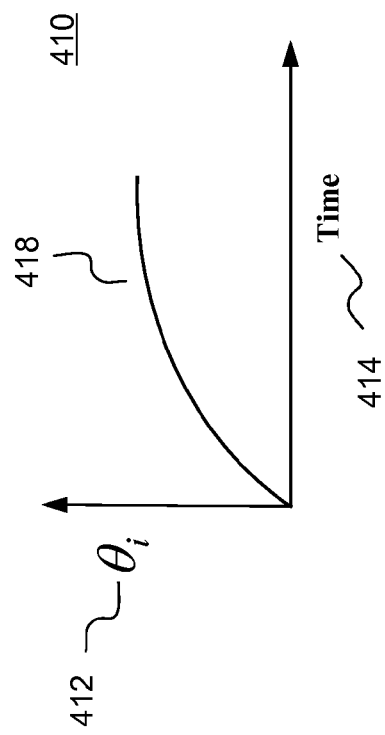

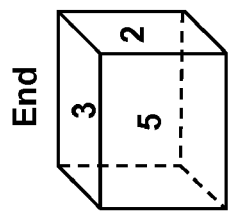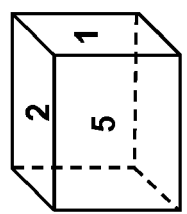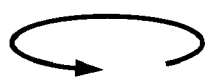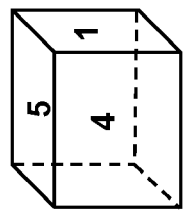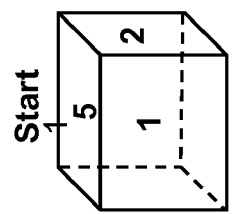
*FIG. 5B*
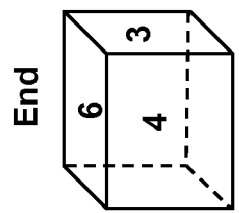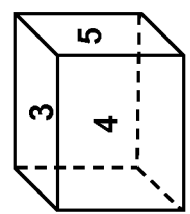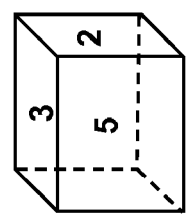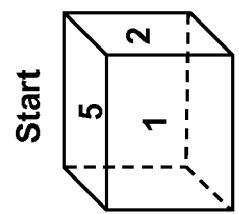
*FIG. 5C*

METHOD AND SYSTEM FOR PRESCRIBING RIGID BODY ORIENTATIONS IN FINITE ELEMENT ANALYSIS

BACKGROUND

1. Field of the Invention

The present invention generally relates to a method, system and software product used in the area of mechanical computer-aided engineering design and analysis, more particularly to method and system for prescribing rigid body orientations in finite element analysis.

2. Description of the Related Art

Finite element analysis (FEA) is a computerized method widely used in industry to model and solve engineering problems relating to complex systems such as three-dimensional non-linear structural design and analysis. FEA derives its name from the manner in which the geometry of the object under consideration is specified. With the advent of the modern digital computer, FEA has been implemented as FEA software. Basically, the FEA software is provided with a model of the geometric description and the associated material properties at each point within the model. In this model, the geometry of the system under analysis is represented by solids, shells and beams of various sizes, which are called elements. The vertices of the elements are referred to as nodes. The model is comprised of a finite number of elements, which are assigned a material name to associate with material properties. The model thus represents the physical space occupied by the object under analysis along with its immediate surroundings. The FEA software then refers to a table in which the properties (e.g., stress-strain constitutive equation, Young's modulus, Poisson's ratio, thermo-conductivity) of each material type are tabulated. Additionally, the conditions at the boundary of the object (i.e., loadings, physical constraints, etc.) are specified. In this fashion a model of the object and its environment is created.

Rigid body is defined as a body whose parts all have a fixed relationship to each other. Rigid bodies have been included in the finite element analysis software to model mechanical parts that is rigid or at least relatively rigid compared to other parts to be analyzed. However, main features of finite element analysis software have been focused on various elements (e.g., solids, shells, beams). Rigid bodies are added to complement the main features. As a result, many of the operations on the rigid bodies are approximations with assumption of small displacements. For example, to prescribe the orientation of a rigid body, the calculations are incremental based, thereby the results are incorrect for arbitrary orientations.

It is therefore desirable to have a new improved method and system for prescribing rigid body orientations in a finite element analysis.

SUMMARY

This section is for the purpose of summarizing some aspects of the present invention and to briefly introduce some preferred embodiments. Simplifications or omissions in this section as well as in the abstract and the title herein may be made to avoid obscuring the purpose of the section. Such simplifications or omissions are not intended to limit the scope of the present invention.

The present invention discloses a system, method and software product for prescribing rigid body orientations in a finite element analysis. According to one aspect of the present invention, user defines a rigid body orientation time history based on a variety of schemes including, but not limited to, direction cosines, orientation angles, Euler parameters, Rodriguez parameters, and Caley-Klein parameters. The unique combination in one of the schemes is converted to direction cosine time history first. The direction cosine matrix can then be interpolated from either the defined or the converted direction cosine time history at each solution cycle. The time derivative of the direction cosine matrix and the resulting angular velocity matrix are calculated. The solution for the equation of motions is obtained using calculated angular velocity for each solution cycle until the simulation ends. According to another aspect, the present invention interpolates user specified rigid body orientations time history in several schemes including, piecewise linear, cubic spline, and the likes.

According to one embodiment, the present invention is a method for prescribing rigid body orientations in finite element analysis. The method includes at least the following: (a) receiving a set of rigid body orientation time history definitions; (b) updating a current simulation time for current solution cycle; (c) converting the definitions to a set of direction cosine time histories, when the definitions are other than direction cosine; (d) obtaining a direction cosine matrix for the current solution cycle by interpolating the set of direction cosine time histories at the current simulation time; (e) calculating time derivative of the direction cosine matrix and corresponding angular velocity matrix; (f) calculating solution of the finite element analysis at the current solution cycle using the angular velocity and the direction cosine matrix; and (g) when the current simulation time is less than a pre-defined total simulation time, repeating (b) to (f)

One of the objects, features, and advantages of the present invention is to accurately prescribe the rigid body orientations instead of using approximations.

Other objects, features, and advantages of the present invention will become apparent upon examining the following detailed description of an embodiment thereof, taken in conjunction with the attached drawings.

BRIEF DESCRIPTION OF THE DRAWINGS

These and other features, aspects, and advantages of the present invention will be better understood with regard to the following description, appended claims, and accompanying drawings as follows:

FIG. 4A is a diagram showing an exemplary rigid body orientation based on orientation angles time history in accordance with one embodiment of the present invention;

FIGS. 4B and 4C are a couple of tables listing exemplary orders or rotation sequences for maneuvering a rigid body from the first orientation to the second orientation in accordance with one embodiment of the present invention;

FIGS. 5B and 5C are two diagrams showing two different sequences of rotations of the exemplary rigid body of FIG. 5A.

DESCRIPTION

In the following description, numerous specific details are set forth in order to provide a thorough understanding of the present invention. However, it will become obvious to those skilled in the art that the present invention may be practiced without these specific details. The descriptions and representations herein are the common means used by those experienced or skilled in the art to most effectively convey the substance of their work to others skilled in the art. In other instances, well-known methods, procedures, components, and circuitry have not been described in detail to avoid unnecessarily obscuring aspects of the present invention.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments mutually exclusive of other embodiments. Further, the order of blocks in process flowcharts or diagrams representing one or more embodiments of the invention do not inherently indicate any particular order nor imply any limitations in the invention.

Embodiments of the present invention are discussed herein with reference to FIGS. 1A-6. However, those skilled in the art will readily appreciate that the detailed description given herein with respect to these figures is for explanatory purposes as the invention extends beyond these limited embodiments.

Figure 1A:
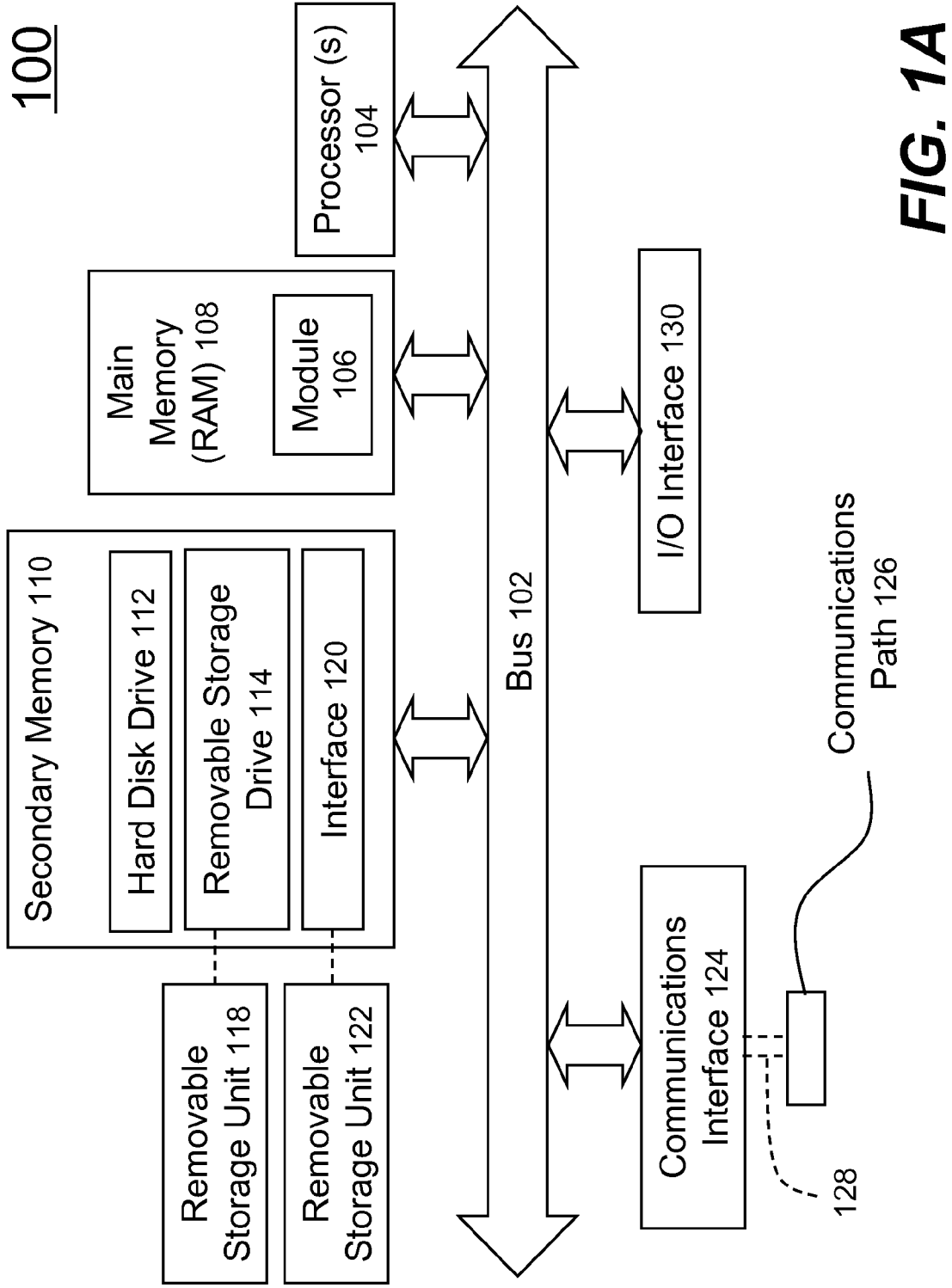
FIG. 1A is a block diagram depicting an exemplary computer, in which one embodiment of the present invention may be implemented.

Referring now to the drawings, in which like numerals refer to like parts throughout several views. The present invention may be implemented using hardware, software or a combination thereof and may be implemented in a computer system or other processing system. In fact, in one embodiment, the invention is directed towards one or more computer systems capable of carrying out the functionality described herein. An example of a computer system 100 is shown in FIG. 1A. The computer system 100 includes one or more processors, such as processor 104. The processor 104 is connected to a computer system internal communication bus 102. Various software embodiments are described in terms of this exemplary computer system. After reading this description, it will become apparent to a person skilled in the relevant art(s) how to implement the invention using other computer systems and/or computer architectures.

Computer system 100 also includes a main memory 108, preferably random access memory (RAM), and may also include a secondary memory 110. The secondary memory 110 may include, for example, one or more hard disk drives 112 and/or one or more removable storage drives 114, representing a floppy disk drive, a magnetic tape drive, an optical disk drive, etc. The removable storage drive 114 reads from and/or writes to a removable storage unit 118 in a well-known manner. Removable storage unit 118, represents a floppy disk, magnetic tape, optical disk, etc. which is read by and written to by removable storage drive 114. As will be appreciated, the removable storage unit 118 includes a computer usable storage medium having stored therein computer software and/or data.

In alternative embodiments, secondary memory 110 may include other similar means for allowing computer programs or other instructions to be loaded into computer system 100. Such means may include, for example, a removable storage unit 122 and an interface 120. Examples of such may include a program cartridge and cartridge interface (such as that found in video game devices), a removable memory chip (such as an EPROM, universal serial bus USB flash memory, or PROM) and associated socket, and other removable storage units 122 and interfaces 120 which allow software and data to be transferred from the removable storage unit 122 to computer system 100. In general, Computer system 100 is controlled and coordinated by operating system (OS) software, which performs tasks such as process scheduling, memory management, networking and I/O services. Exemplary OS includes Linux®, Microsoft Windows®.

There may also be a communications interface 124 connecting to the bus 102. Communications interface 124 allows software and data to be transferred between computer system 100 and external devices. Examples of communications interface 124 may include a modem, a network interface (such as an Ethernet card), a communications port, a PCMCIA slot and card, etc. Software and data transferred via communications interface 124 are in the form of signals 128 which may be electronic, electromagnetic, optical, or other signals capable of being received by communications interface 124. These signals 128 are provided to communications interface 124 via a communications path (i.e., channel) 126. This channel 126 carries signals (or data flows) 128 and may be implemented using wire or cable, fiber optics, a phone line, a cellular phone link, an RF link, a Bluetooth® wireless link and other communications channels.

The channel 126 facilitates a data flow 128 between a data network and the computer 100 and typically executes a special set of rules (i.e., a protocol) to send data back and forth. One of the common protocols is TCP/IP (Transmission Control Protocol/Internet Protocol) commonly used in the Internet. In general, the communication interface 124 manages the assembling of a data file into smaller packets that are transmitted over the data network or reassembles received packets into the original data file. In addition, the communication interface 124 handles the address part of each packet so that it gets to the right destination or intercepts packets destined for the computer 100.

In this document, the terms "computer program medium" and "computer usable medium" are used to generally refer to media such as removable storage drive 114, a hard disk installed in hard disk drive 112, and signals 128. These computer program products are means for providing software to computer system 100. The invention is directed to such computer program products.

The computer system 100 may also include an I/O interface 130, which provides the computer system 100 to access monitor, keyboard, mouse, printer, scanner, plotter, and alike.

Computer programs (also called computer control logic) are stored as application modules 106 in main memory 108 and/or secondary memory 110. Computer programs may also be received via communications interface 124. Such computer programs, when executed, enable the computer system 100 to perform the features of the present invention as discussed herein. In particular, the computer programs, when executed, enable the processor 104 to perform features of the present invention. Accordingly, such computer programs represent controllers of the computer system 100.

In an embodiment where the invention is implemented using software, the software may be stored in a computer program product and loaded into computer system 100 using removable storage drive 114, hard drive 112, or communications interface 124. The application module 106, when executed by the processor 104, causes the processor 104 to perform the functions of the invention as described herein.

The main memory 108 may be loaded with one or more application modules 106 that can be executed by one or more processors 104 with or without a user input through the I/O interface 130 to achieve desired tasks. In operation, when at least one processor 104 executes one of the application modules 106, the results are computed and stored in the secondary memory 110 (i.e., hard disk drive 112). The status of the finite element analysis is reported to the user via the I/O interface 130 either in a text or in a graphical representation.

In one embodiment, an application module 106 is configured to facilitate the creation of a finite element analysis model to represent a structure to be simulated. The module 106 allows the user/design/engineer to define a desired time step. In another embodiment, an application module 106 is configured to facilitate the calculation of the required added mass to stabilize the explicit method with desired time step size. In yet another embodiment, an application module 106 is configured to facilitate the creation of the added mass matrix for each of the chosen elements. In yet still another embodiment, an application module 106 is configured to facilitate the iterative solution procedure to solve the explicit method.

Figure 1B:
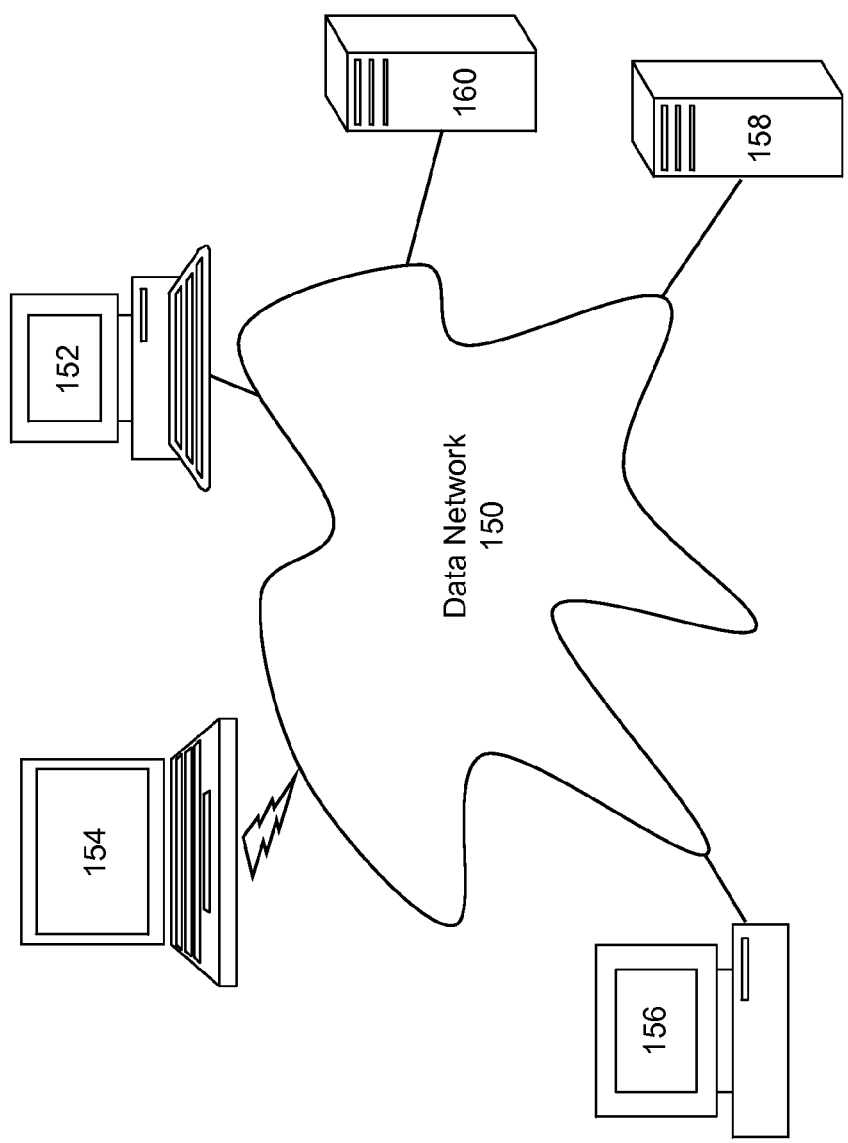
FIG. 1B is a diagram showing an exemplary network environment that one embodiment of the present invention may be deployed.

FIG. 1B depicts a networked computing environment 140, in which one embodiment of the present invention may be practiced. A plurality of network capable computing devices 152, 154, 156, 158 and 160 (e.g., the computer device 100 described in FIG. 1A) are coupled to a data network 150. These computing devices 152-160 can communicate with each other via the network 150. The data network 150 may include, but is not limited to, the Internet, an Intranet, local area network (LAN), wide area network (WAN), a wireless network or a data network comprises of public and private networks. In one embodiment, a software module (e.g., 106 in FIG. 1A) for a finite element analysis may be configured and executed on a computing device 158, while the pre- and post-processing of the simulation are conducted on another computing device 156 by users/designers/engineers. The input file and the output results file are transmitted over the data network 150 between the computing device 158 and the computing device 156. During the execution of the application module, the user may be able to monitor the progress of the analysis at another computing device 154. One exemplary implementation of this technique is included in a suite of engineering analysis computer software products, LS-PRE-POST® and LS-DYNA®, offered by Livermore Software Technology Corporation, Livermore, Calif., USA.

Figure 2:
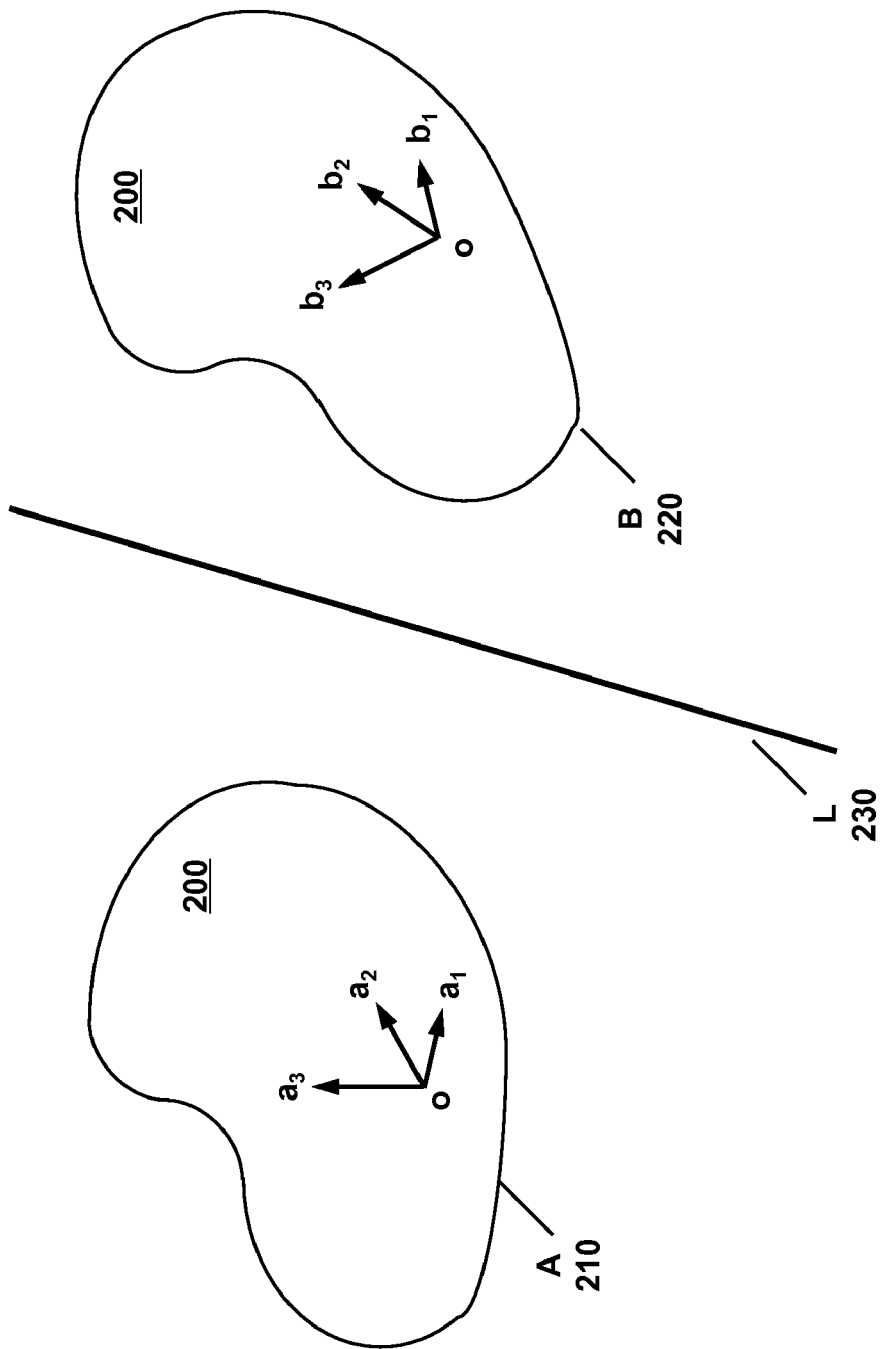
FIG. 2 is a diagram illustrating an exemplary rigid body in two orientations.

FIG. 2 is a diagram illustrating an exemplary rigid body 200 in orientations A 210 and B 220. The first orientation A 210 is described by a first dextral set of mutually perpendicular unit vectors $(a_1, a_2, a_3)$ fixed in the rigid body 200. The second orientation B 220 is described by a second set of unit vectors $(b_1, b_2, b_3)$ also fixed in the rigid body. These two orientations represent the rigid body 200 at two different locations in time and serve as reference frames A and B. The first orientation A 210 is at time $t_0$ and the second orientation B 220 is at time $t_1$. The motion of rigid body 200 is called a simple rotation if there exists a line L 230 called an axis of rotation whose orientation relative to both reference frames A and B remains unaltered throughout the motion.

Figure 3:
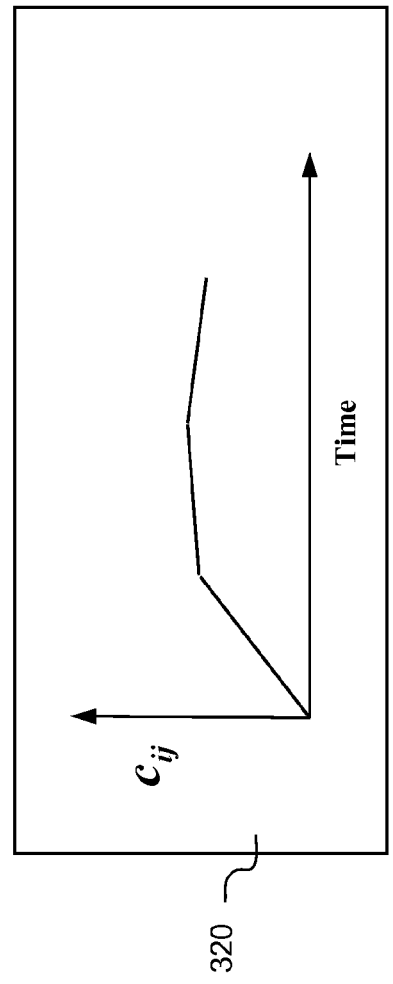
FIG. 3 is a diagram showing an exemplary direction cosine time history of a rigid body in accordance with one embodiment of the present invention.

FIG. 3 a diagram showing an exemplary direction cosine time history of a rigid body in accordance with one embodiment of the present invention. Direction cosine between two rigid body orientations (e.g., A 210 and B 220 of FIG. 2) is listed as the formula 310, in which the matrix C includes nine, 3×3, components $c_{ij}$ based on the dextral orthogonal unit vectors $(a_1, a_2, a_3)$ and the vectors $(b_1, b_2, b_3)$. Each of the components of the direction cosine matrix C is a dot product between one of the components of the vector $(a_1, a_2, a_3)$ and the vector $(b_1, b_2, b_3)$. In order to prescribe the orientations of a rigid body precisely, each of the components $c_{ij}$ is specified in time. An exemplary time history 320 is shown in FIG. 3. In one embodiment, the user can specify all nine components of the direction cosine matrix as time history. Each of the histories may be specified in many different schemes including, but not limited to, linear, bi-linear, piecewise linear, quadratic, parabolic, and the likes. Because the direction cosine matrix between two orientations is not measurements, it may not intuitive to create the time history of the components. More direct measurements are generally preferred by user/engineer. One exemplary method is described in the descriptions respect to FIGS. 4A and 4B.

FIG. 4A is a diagram 410 showing an exemplary rigid body orientation based on orientation angles time history in accordance with one embodiment of the present invention. One of the rotation angles $\theta_i$ 412 vs time 414 is plotted as a time history curve 418 in FIG. 4A. In one embodiment, the software module in accordance with the present invention is configured to allow users to specify three time history curves. Each of the curves represents one of the orientation angles for dextral orthogonal axes of the coordinate system of a rigid body (e.g., reference frame A $a_1 a_2 a_3$ in FIG. 2). In addition, the order for applying these three rotations is also specified. As a result, a unique ending orientation (e.g., the second orientation B 220) of the rigid body is ensured from the starting orientation (e.g., the first orientation A 210).

Exemplary orders or rotation sequences for maneuvering a rigid body from the first orientation to the second orientation are listed as a couple of tables in FIGS. 4B and 4C in accordance with one embodiment of the present invention. FIG. 4B shows six different first sequences 440 with each sequence including three order dependent rotations, one for each of the axes of the dextral coordinate system. FIG. 4C lists six different second sequences 450 with each sequence consisting three order dependent rotations. Instead of one rotation for each of the axes, the second sequences 450 are as designated as follows: the first and third rotations are applied to the same one of the axes, and the second rotation is applied to one of the other axes.

Figure 5A:
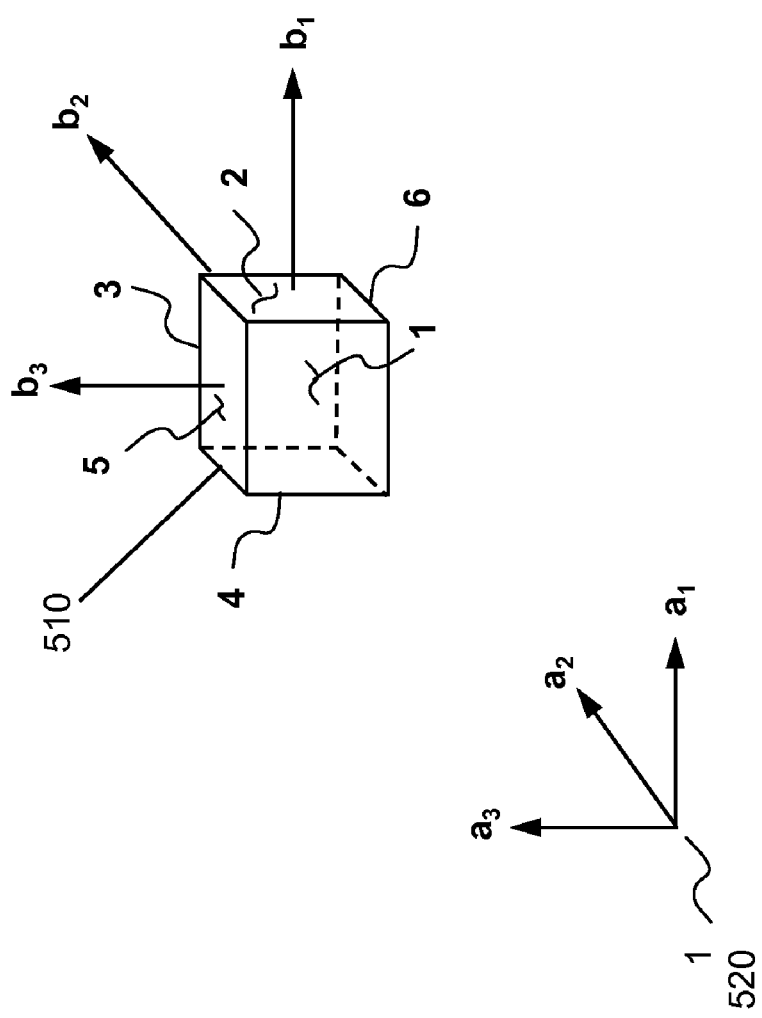
FIG. 5A is a diagram showing an exemplary rigid body.

To demonstrate the order or rotation sequence is order-dependent for positioning a rigid body from one orientation to another, an exemplary rigid body 510 is used as shown in FIG. 5A. The rigid body 510 is a hexahedron with a front face 1, a rear face 3, a top face 5, a bottom face 6, and two side faces 2 and 4. The orientation angles $(\theta_1, \theta_2, \theta_3)$ can be applied to certain ones of the three axes (i.e., $b_1$, $b_2$, or $b_3$) of a dextral orthogonal body coordinate system fixed at the center of the rigid body 510. The rigid body 510 can also be referenced in a space coordinate system 520, which may be the body coordinate system of the rigid body 510 in another orientation.

For each of the rotation sequences in the tables of FIGS. 4B and 4C, there are two manners to apply rotations to the rigid body 510: space or body reference. A set of three orientation angles $\theta_1$, $\theta_2$, and $\theta_3$ denotes as the first, the second and the third rotation, respectively. For a rotation sequence called 'Body-three: 1-2-3', it corresponds to $\theta_1 b_1$, $\theta_2 b_2$, $\theta_3 b_3$. 'Space-two: 1-2-1' corresponds to $\theta_1 a_1$, $\theta_2 a_2$, $\theta_3 a_1$. Each of these rotational sequences can be expressed as direction cosine matrix between two orientations of the rigid body 510. Exemplary direction cosine matrixes are listed below:

| Body-three: 2-3-1 | | | |
|---|---|---|---|
| | $b_1$ | $b_2$ | $b_3$ |
| $a_1$ | $c_1 c_2$ | $-c_1 s_2 c_3 + s_3 s_1$ | $c_1 s_2 s_3 + c_3 s_1$ |
| $a_2$ | $s_2$ | $c_2 c_3$ | $-c_2 s_3$ |
| $a_3$ | $-s_1 c_2$ | $s_1 s_2 c_3 + s_3 c_1$ | $-s_1 s_2 s_3 + c_3 c_1$ |

| Space-two: 2-3-2 | | | |
|---|---|---|---|
| | $b_1$ | $b_2$ | $b_3$ |
| $a_1$ | $c_1 c_2 c_3 - s_3 s_1$ | $-s_2 c_3$ | $s_1 c_2 c_3 + s_3 c_1$ |
| $a_2$ | $c_1 s_2$ | $c_2$ | $s_1 s_2$ |
| $a_3$ | $-c_1 c_2 s_3 - c_3 s_1$ | $s_2 s_3$ | $-s_1 s_2 s_3 + c_3 c_1$ | where $c_i = \cos \theta_i$, $s_i = \sin \theta_i$, $i=1, 2, 3$.

FIGS. 5B and 5C are two diagrams showing two different sequences of rotations of the rigid body 510. The rotation sequence used in FIG. 5B is 'Space-three: 3-1-2 ', which means that the three rotations applied to the rigid body 510 is in the following steps: i) rotating $\theta_1$ about axis $a_3$, ii) rotating $\theta_2$ about axis $a_1$, and iii) rotating $\theta_3$ about axis $a_2$. FIG. 5C is 'Space-three: 1-3-2 ' for i) rotating $\theta_1$ about axis $a_1$, ii) rotating $\theta_2$ about axis $a_3$, and iii) rotating $\theta_3$ about axis $a_2$. The orientation angles, $\theta_1$, $\theta_2$ and $\theta_3$, used in FIGS. 5B and 5C are all set to 90-deg. So the only difference in these two sequences is the first and the second rotations are inverted. As evidenced by in FIGS. 5B and 5C, the ending orientations of the rigid body 510 are different even though both rotation sequences are started in the exact same orientation.

Figure 6:
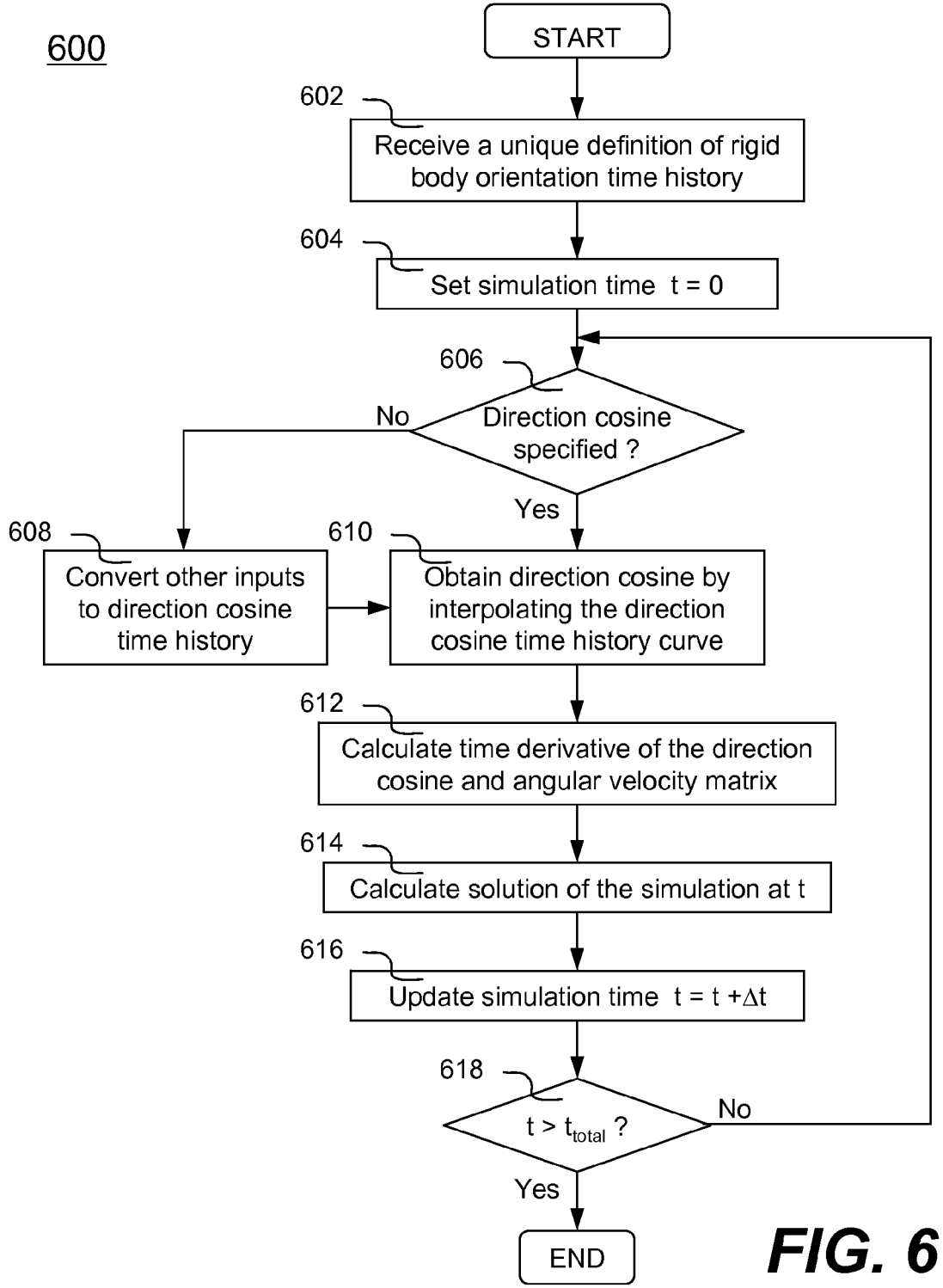
FIG. 6 is a flow chart showing the process of prescribing rigid body orientations in a finite element analysis in accordance with one embodiment of the present invention.

FIG. 6 is a flow chart showing the process 600 of prescribing rigid body orientations in a finite element analysis in accordance with one embodiment of the present invention. The process 600, which is preferably understood in conjunction with the previous figures, may be implemented in software. Process 600 starts by receiving a set of user defined rigid body orientation time history at 602. Types of the rigid body orientation time history may include, but not be limited to, direction cosine, orientation angles, Euler parameters, Rodriguez parameters, Caley-Klein parameters, and the likes. After the user input has been received, the process 600 moves to 604 to start the simulation or finite element solution by setting the current simulation time t equal to zero. Then the process 600 checks whether direction cosine has been defined as the rigid body orientation time history at test 606. If the test 606 is false, the process 600 follows the 'No' branch to 608 by converting other rigid body time history definitions to the direction cosine definitions. In one embodiment, the orientation angles are converted into direction cosine in the descriptions referenced to FIG. 5A thereof. If the test 606 is true, the conversion is not required. The process 600 follows the 'Yes' branch to 610 directly. At 610, the process 600 obtains the direction cosine of the rigid body for solution cycle at time t by interpolating the direction cosine time history either from user definition or converted by the process 600. In one embodiment, the interpolation is performed using piecewise linear scheme. In another embodiment, the cubic spline interpolation scheme is used. In yet another embodiment, a local moving window quadratic interpolation scheme is employed. Next at 612, the process 600 calculates the time derivative of the direction cosine obtained at 610, and hence the angular velocity matrix. The process 600 calculates the simulation or finite element solution using the angular velocity and direction cosine at each solution cycle at time t at 614. The process 600 then updates the simulation time t at 616. In one embodiment, the simulation time is updated by incrementing the current simulation time t with $\Delta t$ (i.e., the time step size). The process 600 moves to a test 618, in which the current simulation time t is compared with a pre-determined total simulation time $t_{total}$. If the test 618 is false, the process 600 moves back to 606 repeating the above described steps for another solution at the new solution cycle until the test 618 has become true and the process 600 ends.

The angular velocity matrix $\tilde{\omega}$ is calculated as follows: if two rigid bodies are moving relative to each other in two orientations (e.g., orientations A 210 and B 220 of FIG. 2), then the direction cosine matrix C and its elements $c_{ij}$ 310 are functions of time. The time derivative of C, denoted by $\dot{C}$ and defined in terms of time derivatives $\dot{c}_{ij}$ of $c_{ij}$ (I,j=1, 2, 3) as $$\dot{C} = \begin{bmatrix} \dot{c}_{11} & \dot{c}_{12} & \dot{c}_{13} \\ \dot{c}_{21} & \dot{c}_{22} & \dot{c}_{23} \\ \dot{c}_{31} & \dot{c}_{32} & \dot{c}_{33} \end{bmatrix}$$

can be expressed as the product of C and a skew-symmetric matrix $\tilde{\omega}$ called an angular velocity matrix for orientation B 220 in orientation A 210 and defined as $\tilde{\omega} = C^T \dot{C}$ or $\dot{C} = C\tilde{\omega}$.

$$\tilde{\omega} = \begin{bmatrix} 0 & -\omega_3 & \omega_2 \\ \omega_3 & 0 & -\omega_1 \\ -\omega_2 & \omega_1 & 0 \end{bmatrix}$$

where $$\omega_1 = C_{13}\dot{C}_{12} + C_{23}\dot{C}_{22} + C_{33}\dot{C}_{32}$$
$$\omega_2 = C_{21}\dot{C}_{23} + C_{31}\dot{C}_{33} + C_{11}\dot{C}_{13}$$
$$\omega_3 = C_{32}\dot{C}_{31} + C_{12}\dot{C}_{11} + C_{22}\dot{C}_{21}$$

and the angular velocity of the rigid body B 220 in reference to A 210 is $$\omega = \omega_i \cdot b_i (i=1, 2, 3)$$

Although an exemplary embodiment of invention has been disclosed, it will be apparent to those skilled in the art that various changes and modifications may be made to achieve the advantage of the invention. It will be obvious to those skilled in the art that some components may be substituted with another component providing the same function. The appended claims cover the present invention.

What is claimed is:

1. A method of simulating motions of a rigid body from a set of known rigid body orientations, using a finite element analysis model, the method comprising:
   (a) receiving, in a computer system having a finite element analysis application module installed thereon, a set of known rigid body orientation time history definitions;
   (b) updating a current simulation time for current solution cycle;

(c) converting the definitions to a set of direction cosine time histories, when the definitions are other than direction cosine;

(d) obtaining a direction cosine matrix for the current solution cycle by interpolating the set of direction cosine time histories at the current simulation time;

(e) calculating time derivative of the direction cosine matrix and corresponding angular velocity matrix;

(f) calculating the rigid body's motions at the current solution cycle using the finite element analysis model and the calculated angular velocity matrix and the interpolated direction cosine matrix, wherein the calculated rigid body's motions are saved into a file on a storage device and are graphically displayed on a monitor based on user's instructions; and (g) if the current simulation time is less than a pre-defined total simulation time, repeating (b) to (g).

2. The method of claim 1, wherein the known rigid body orientation time history definitions include, but are not limited to, direction cosines, orientation angles, Euler parameters, Rodriguez parameters, and Caley-Klein parameters.

3. The method of claim 2, wherein the set of known rigid body orientation time history definitions is defined as a curve with characteristics including, but not limited to, linear, multi-linear, cubic, and curved.

4. The method of claim 1, said updating the current simulation time further includes:

initializing the current simulation time when the solution of the finite element analysis first starts; and incrementing the current simulation time with a time step Δt.

5. The method of claim 1, wherein the interpolating is conducted with schemes including, but not limited to, piecewise linear, cubic spline, moving window.

6. A computer recordable storage medium having computer executable instructions which, when executed on a computer, perform a method of simulating motions of a rigid body from a set of known rigid body orientations using a finite element analysis model, the method comprising:

receiving a set of known rigid body orientation time history definitions;

updating a current simulation time for current solution cycle;

converting the definitions to a set of direction cosine time histories, when the definitions are other than direction cosine;

obtaining a direction cosine matrix for the current solution cycle by interpolating the set of direction cosine time histories at the current simulation time;

calculating time derivative of the direction cosine matrix and corresponding angular velocity matrix;

calculating the rigid body's motions at the current solution cycle using the finite element analysis model and the calculated angular velocity matrix and the interpolated direction cosine matrix, wherein the calculated rigid body's motions are saved into a file on a storage device and are graphically displayed on a monitor based on user's instructions; and if the current simulation time is less than a pre-defined total simulation time, repeating the steps of updating a current simulation time, converting the definitions, obtaining a direction cosine matrix, calculating time derivative, and calculating the rigid body's motions.

7. The computer recordable storage medium claim 6, wherein the known rigid body orientation time history definitions include, but are not limited to, direction cosine, orientation angles, Euler parameters, Rodriguez parameters, and Caley-Klein parameters.

8. The computer recordable storage medium of claim 7, wherein the set of known rigid body orientation time history definitions I defined as a curve with characteristics including, but not limited to, linear, multi-linear, cubic, and curved.

9. The computer recordable storage medium of claim 6, said updating the current simulation time further includes:

initializing the current simulation time when the solution of the finite element analysis first starts; and incrementing the current simulation time with a time step Δt.

10. The computer recordable storage medium of claim 6, wherein the interpolating is conducted with schemes including, but not limited to, piecewise linear, cubic spline, moving window.

11. A system for simulating motions of a rigid body from a set of known rigid body orientations using a finite element analysis model, the system comprising:

an I/O interface;

a communication interface;

a secondary memory;

a main memory for storing computer readable code for a finite element analysis application module;

at least one processor coupled to the main memory, the secondary memory, the I/O interface, and the communication interface, said at least one processor executing the computer readable code in the main memory to cause the finite element analysis application module to perform operations of:

(a) receiving a set of known rigid body orientation time history definitions;

(b) updating a current simulation time for current solution cycle;

(c) converting the definitions to a set of direction cosine time histories, when the definitions are other than direction cosine;

(d) obtaining a direction cosine matrix for the current solution cycle by interpolating the set of direction cosine time histories at the current simulation time;

(e) calculating time derivative of the direction cosine matrix and corresponding angular velocity matrix;

(f) calculating the rigid body's motions at the current solution cycle using the finite element analysis model and the calculated angular velocity matrix and the interpolated direction cosine matrix, wherein the calculated rigid body's motions are saved into a file on a storage device and are graphically displayed on a monitor based on user's instructions; and (g) if the current simulation time is less than a pre-defined total simulation time, repeating (b) to (g).

12. The system of claim 11, wherein the known rigid body orientation time history definitions include, but are not limited to, direction cosine, orientation angles, Euler parameters, Rodriguez parameters, and Caley-Klein parameters.

13. The system of claim 12, wherein the set of known rigid body orientation time history definitions is defined as a curve with characteristics including, but not limited to, linear, multi-linear, cubic, and curved.

14. The system of claim 11, said updating the current simulation time further includes:
   initializing the current simulation time when the solution of the finite element analysis first starts; and
   incrementing the current simulation time with a time step $\Delta t$.

15. The system of claim 11, wherein the interpolating is conducted with schemes including, but not limited to, piecewise linear, cubic spline, moving window.

* * * * *